(12) United States Patent
Chun et al.

(10) Patent No.: US 11,499,233 B2
(45) Date of Patent: Nov. 15, 2022

(54) PLATED LAMINATE AND PRINTED CIRCUIT BOARD

(71) Applicant: YMT CO., LTD., Incheon (KR)

(72) Inventors: Sung Wook Chun, Incheon (KR); Bo Mook Chung, Incheon (KR); Myong Whan Park, Incheon (KR)

(73) Assignee: YMT CO., LTD., Incheon (KR)

( * ) Notice: Subject to any disclaimer, the term of this patent is extended or adjusted under 35 U.S.C. 154(b) by 0 days.

(21) Appl. No.: 17/043,638

(22) PCT Filed: Oct. 14, 2019

(86) PCT No.: PCT/KR2019/013407
§ 371 (c)(1),
(2) Date: Sep. 29, 2020

(87) PCT Pub. No.: WO2020/101183
PCT Pub. Date: May 22, 2020

(65) Prior Publication Data
US 2021/0017650 A1    Jan. 21, 2021

(30) Foreign Application Priority Data
Nov. 14, 2018  (KR) ......................... 10-2018-0139699

(51) Int. Cl.
| | |
|---|---|
| *H05K 1/05* | (2006.01) |
| *C23C 18/38* | (2006.01) |
| *C23C 18/18* | (2006.01) |
| *H05K 3/18* | (2006.01) |

(52) U.S. Cl.
CPC .......... *C23C 18/38* (2013.01); *C23C 18/1886* (2013.01); *H05K 1/05* (2013.01); *H05K 3/181* (2013.01); *H05K 2201/0302* (2013.01); *H05K 2201/0332* (2013.01); *H05K 2201/0344* (2013.01); *H05K 2201/0364* (2013.01); *H05K 2203/072* (2013.01)

(58) Field of Classification Search
CPC ........... H05K 1/05; H05K 1/053; H05K 1/056
See application file for complete search history.

(56) References Cited

U.S. PATENT DOCUMENTS

| | | | |
|---|---|---|---|
| 7,071,424 B1* | 7/2006 | Shirai | H05K 3/421 |
| | | | 174/263 |
| 2014/0186651 A1* | 7/2014 | Han | H05K 3/385 |
| | | | 428/612 |
| 2015/0008020 A1* | 1/2015 | Kaneko | H05K 3/465 |
| | | | 174/257 |

FOREIGN PATENT DOCUMENTS

| | | |
|---|---|---|
| JP | H06158336 A | 6/1994 |
| JP | 2001348669 A | 12/2001 |
| JP | 2002030452 A | 1/2002 |

(Continued)

OTHER PUBLICATIONS

JP 2002-030452 A, machine translation, originally published 2002, p. 1-17 (Year: 2002).*

(Continued)

*Primary Examiner* — Jeremy C Norris
(74) *Attorney, Agent, or Firm* — STIP Law Group, LLC

(57) ABSTRACT

Provided is a plating lamination technology for providing a highly adhesive inner layer of a printed circuit board. The plating lamination technology is effective in providing an electroless plated laminate, including a non-etched/low-roughness pretreated laminate or a low-roughness copper foil, and a printed circuit board including the plated laminate.

6 Claims, 6 Drawing Sheets

(56) References Cited

FOREIGN PATENT DOCUMENTS

| KR | 101108991 B1 | 1/2012 |
|---|---|---|
| KR | 101468074 B1 | 12/2014 |
| KR | 1020160116288 A | 10/2016 |

OTHER PUBLICATIONS

International Search Report of PCT/KR2019/013407, dated Jan. 22, 2020, English translation.

* cited by examiner

[Fig. 1(a)]
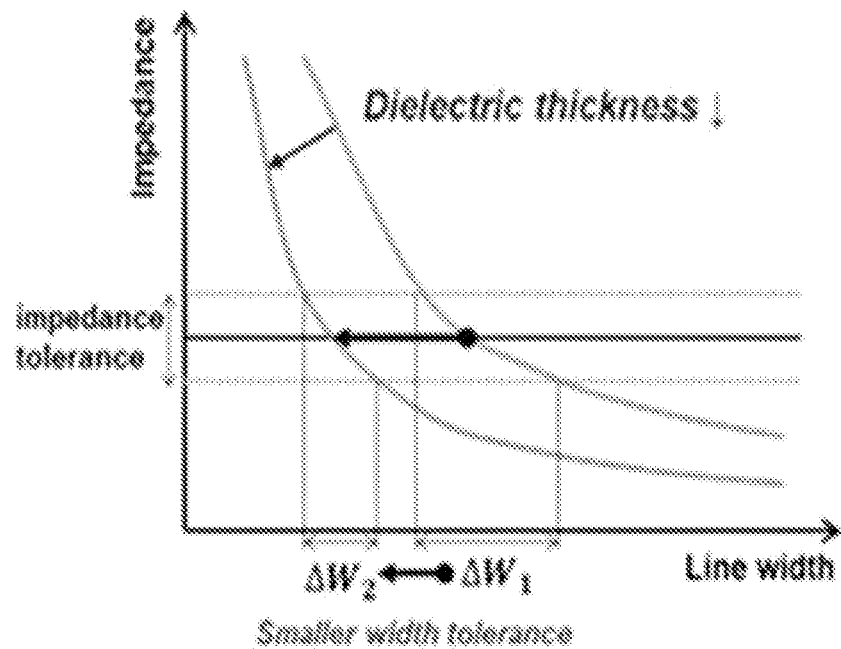
[Fig. 1(b)]
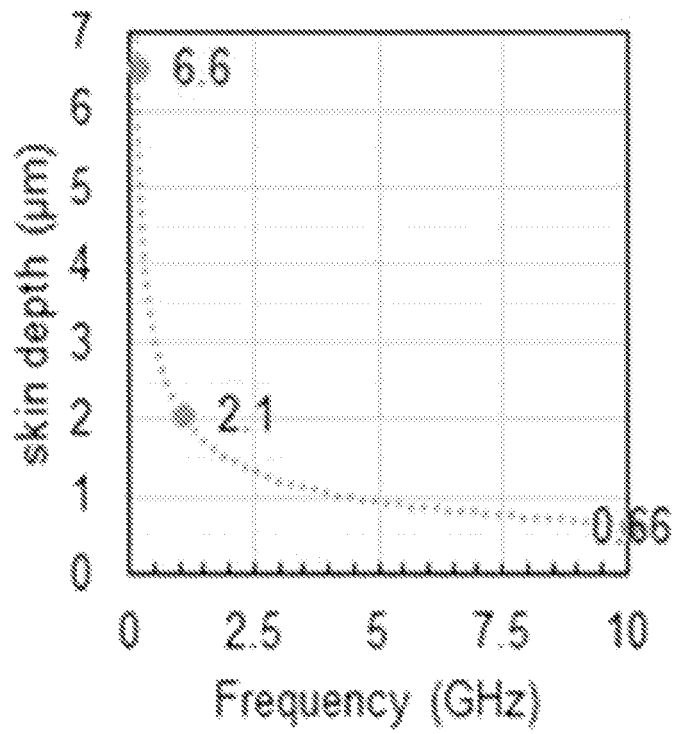

[Fig. 2(a)]
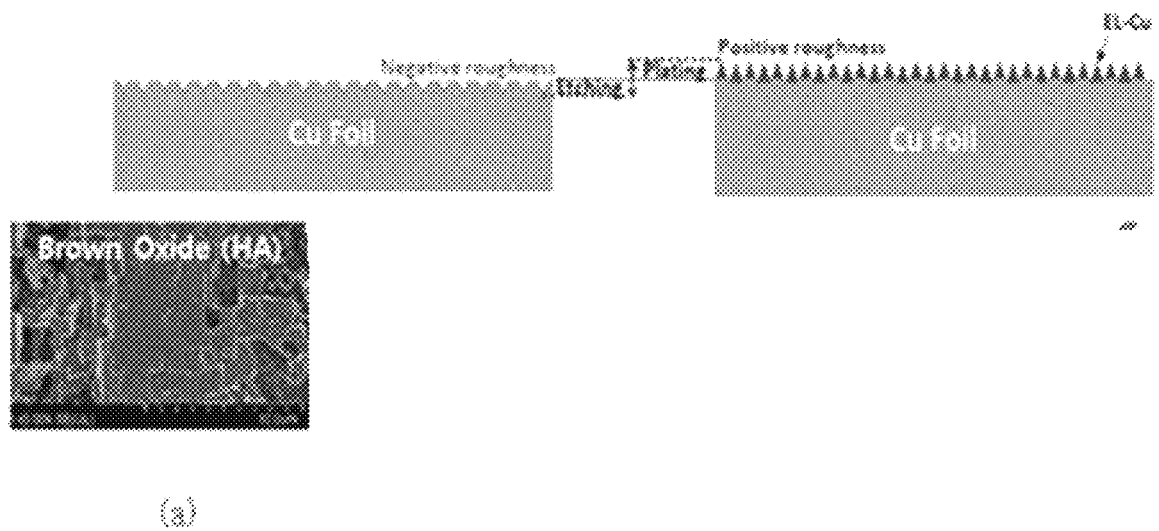
(a)
[Fig. 2(b)]
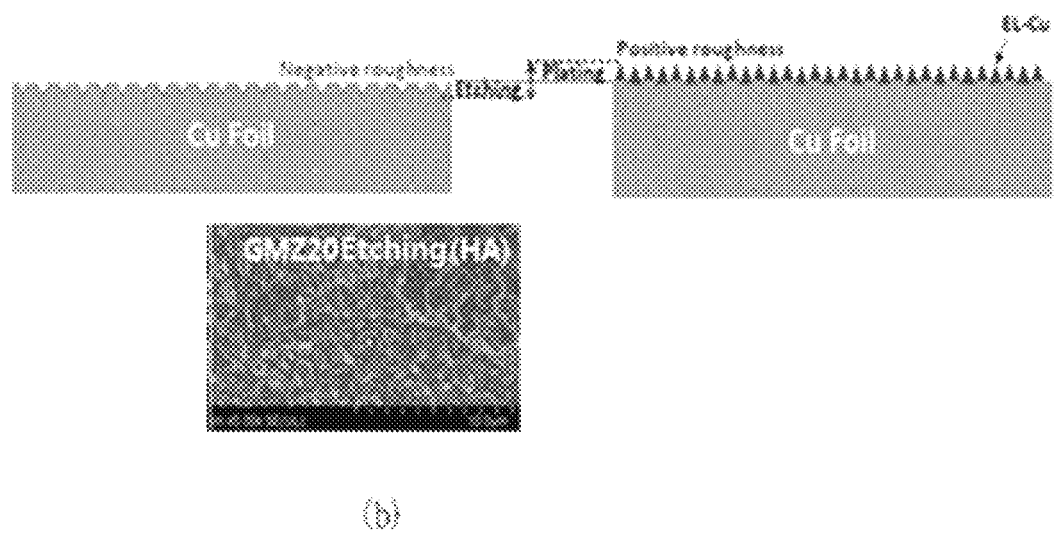
(b)

[Fig. 2(c)]
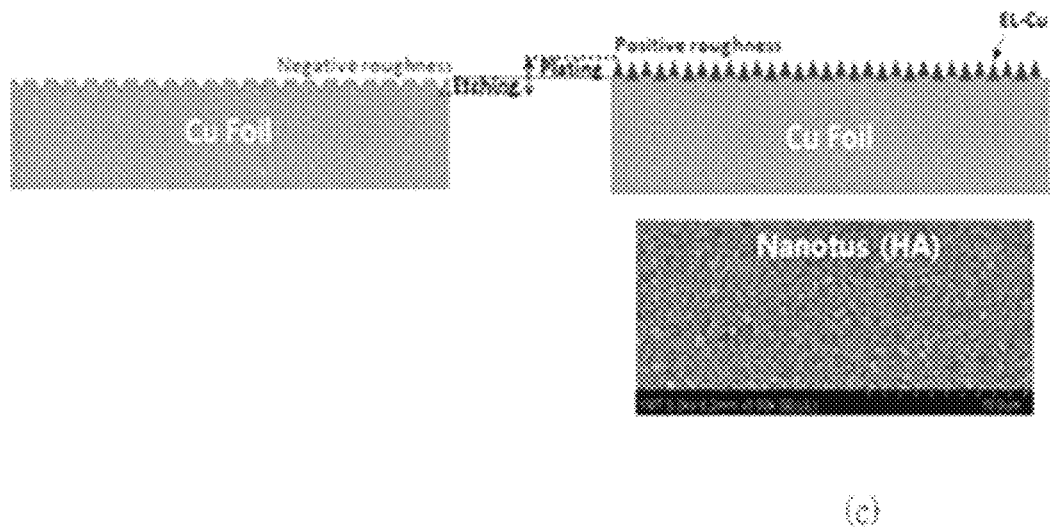
[Fig. 3 (a)]
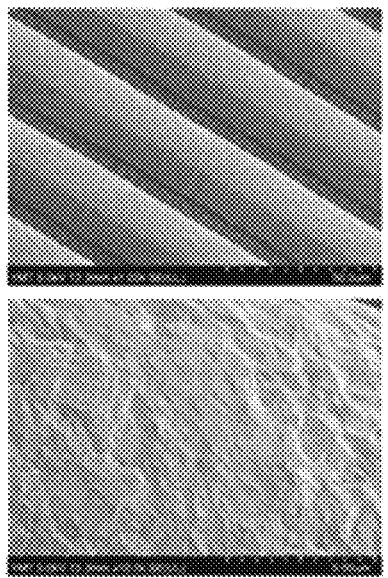

[Fig. 3(b)]
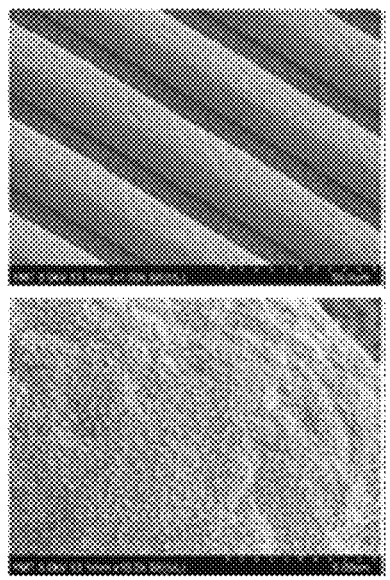
[Fig. 3(c)]
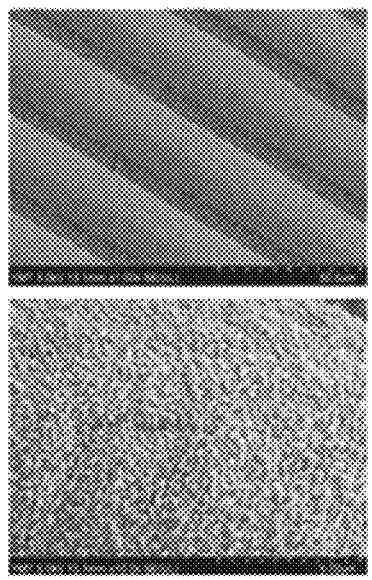

[Fig. 4]
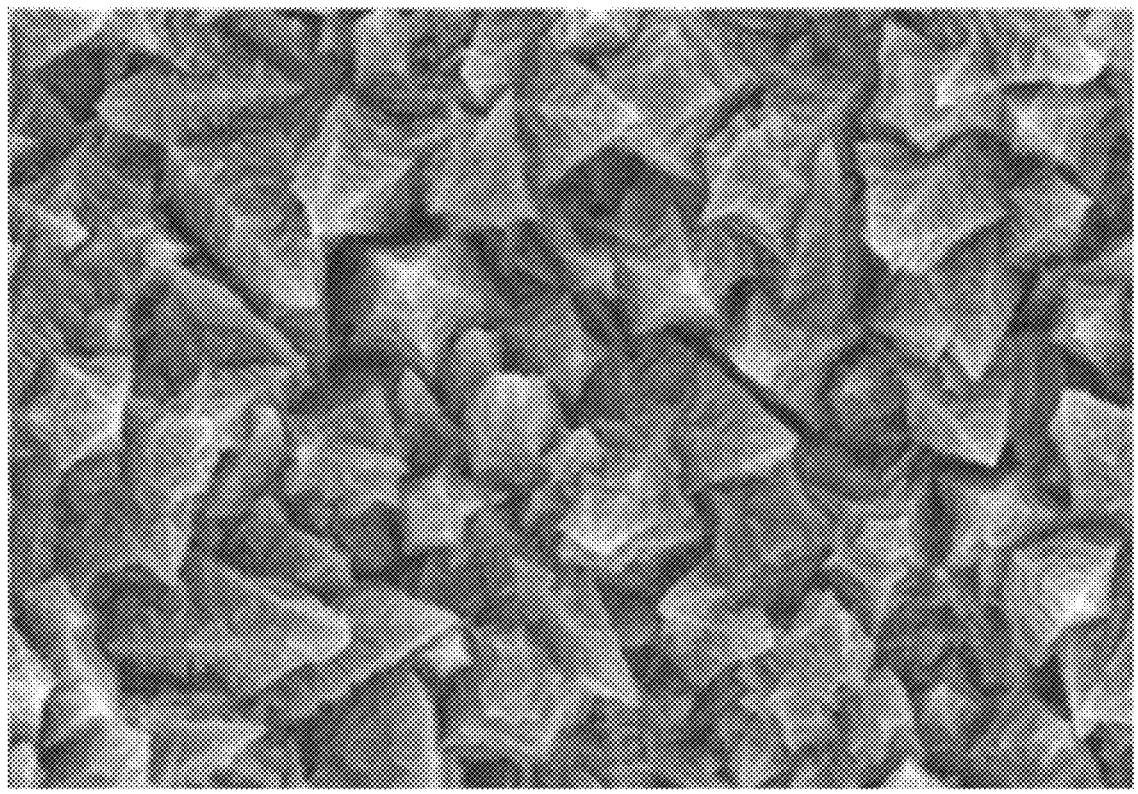

PLATED LAMINATE AND PRINTED CIRCUIT BOARD

CROSS-REFERENCE TO RELATED APPLICATIONS

This application is the U.S. National Phase under 35 U.S.C. § 371 of International Application No. PCT/KR2019/013407 filed on Oct. 14, 2019, which in turn claims the benefit of Korean Application No. 10-2018-0139699, filed on Nov. 14, 2018, the disclosures of which are incorporated by reference into the present application.

TECHNICAL FIELD

The technology described herein relates to a plating lamination technology for providing a highly adhesive inner layer of a printed circuit board, and more specifically to an electroless plated laminate, including a non-etched/low-roughness pretreated laminate or a low-roughness copper foil, and a printed circuit board including the plated laminate.

BACKGROUND ART

The performance of small and lightweight electronic devices and electronic devices using higher frequencies continues to improve in the electronics industry. In practice, semiconductors such as central processing units (CPUs) and application processors (APs) are being developed toward high speed and performance and thus the line and space (L/S) of package substrates for semiconductors becomes narrow continuously.

Based on these trends, there is a continued need to develop technologies for products with improved adhesive strength. Representative technologies are based on the use of black oxide and brown oxide. Commercial brown oxide products are Brown Oxide Prime Bond series products available from YMT. These IT series products are used to improve mechanical bonding strength with Cu roughnesses formed by treatment with black oxide or brown oxide and subsequent reduction treatment, and they are known as advanced non-etching adhesion promoters for IC boards and high-frequency applications. The technologies are used for reliable I/L bonding and solder mask pretreatment and have many advantages in that a signal loss at high frequency is minimized due to adhesion promotion/non-etching properties and the best compatibility with various types of materials is obtained due to the mechanism of mechanical adhesion. Specifically, the technologies enable the formation of ≤15 µm ultrafine lines, improve defect-free signal properties in high-frequency applications, and achieve high adhesive strength compared to when only chemical adhesion promotors are used. Despite these advantages, the technologies based on black oxide or brown oxide may be accompanied by a circuit loss due to the reaction and may pose a risk of desorption of remaining oxide when the reduction treatment is insufficient.

Etching pretreatment agents have received attention as replacements for black oxide or brown oxide. GMZ 20 series products from YMT are typical etching pretreatment agents. These series products can be used not only for package substrates, but also for a wide range of electronic substrates where high reliability is required. However, since signals tend to flow on the surface of a copper foil of a conventional high-frequency substrate, a delay is likely to occur in the transmission of signals when the surface of the copper foil is rough. The GMZ 20 series products have the advantage that a delay in signal transmission is avoided but have the disadvantage that a process for Cu—Sn—Ni alloy removal is further required for patterning.

Thus, there is a need to develop a technology for roughness control that provides high adhesive strength while overcoming the above disadvantages. For reference, FIG. 1 graphically shows (a) a correlation associated with circuit integration and (b) a correlation between frequency and skin depth. In practice, (a) of FIG. 1 reveals limitations in the application of etching lamination pretreatment for microcircuits and (b) of FIG. 1 reveals that roughnesses need to be controlled to about 1 µm or less at 5 GHz and 0.66 µm or less at 10 GHz. However, no technology for strictly controlling limitations in the application of etching lamination pretreatment and roughnesses at high frequencies has been, to the best of our knowledge, reported before. Particularly, the formation of specific roughnesses regardless of the type of plating target would be more desirable from the viewpoint of economic efficiency and market needs.

PRIOR ART DOCUMENTS

Korean Patent No. 1108991

DETAILED DESCRIPTION OF THE INVENTION

Problems to be Solved by the Invention

The technology described herein intends to provide a technology for overcoming limitations in the application of etching lamination pretreatment, strictly controlling roughnesses at high frequencies, and forming uniform roughnesses irrespective of the type of plating target.

Means for Solving the Problems

According to one embodiment of the present invention, there is provided a plated laminate including a plating target and a copper film having a plurality of crystalline protrusions formed on the plating target by electroless copper plating.

Each of the crystalline protrusions may have a shape in which the lower portion is larger in width than the upper portion.

Each of the crystalline protrusions may be formed in a pyramidal shape.

The crystalline protrusions may be copper crystals having a surface roughness Ra of 100 nm or less.

A metal release layer, an organic release layer, an electroplated copper foil or a laminate thereof may be interposed between the plating target and the copper film.

According to a further embodiment of the present invention, there is provided a method for producing a plated laminate, including (a) providing a plating target on a substrate and (b) forming a copper film having a plurality of crystalline protrusions on the surface of the plating target.

In step (b), the copper film having a plurality of crystalline protrusions is formed using a plating solution containing the smallest possible amount of a copper component capable of forming copper seeds on the surface of the plating target and a nitrogen-containing component capable of diffusing the copper seeds to form a plurality of protrusions on the surface of the plating target.

The copper component may form copper seeds on the surface of the plating target and may react with the nitrogen-containing component that allows the seeds to grow.

The copper component may be selected from copper sulfate, copper chloride, copper nitrate, copper hydroxide, and copper sulfamate. The nitrogen-containing component may be a 5- or 6-membered cyclic nitrogen-containing compound.

The 5- or 6-membered cyclic nitrogen-containing compound may be one or more types selected from purine compounds, pyridazine, methylpiperidine, 1,2-di(2-pyridyl)ethylene, 1,2-di(pyridyl)ethylene, 2,2'-dipyridylamine, 2,2'-bipyridyl, 2,2'-, 6,6'-dimethyl-2,2'-dipyridyl, di-2-pyrylketone, N,N,N',N'-tetraethylenediamine, naphthalene, 1,8-bipyrimidinenaphthyridine, 1,6-naphthyridine, tetrathiafulvalene, terpyridine, phthalic acid, isophthalic acid, and 2,2'-dibenzoic acid.

Step (a) may include acid degreasing, pre-dip, and catalytic treatment for pretreatment.

In step (b), the copper film is preferably formed by electroless plating.

The method may further include anti-corrosion treatment after step (b).

According to another embodiment of the present invention, there is provided a printed circuit board including the plated laminate.

Effects of the Invention

The technology described herein is effective in overcoming limitations in the application of etching lamination pretreatment and strictly controlling roughnesses at high frequencies. In addition, the technology described herein is effective in forming uniform roughnesses irrespective of the type of plating target, achieving markedly improved economic efficiency and workability.

BRIEF DESCRIPTION OF THE DRAWINGS

FIG. 1(a) graphically shows a correlation associated with circuit integration and FIG. 1(b) a correlation between frequency and skin depth.

FIG. 2(a), FIG. 2(b) and FIG. 2(c) shows schematic diagrams and images comparing (c) the surface of an ultrathin copper foil on which an electroless plated laminate was formed according to an exemplary embodiment of the present invention, (a) the surface of a copper foil etched with brown oxide according to the prior art, and (b) the surface of a copper foil etched by GMZ 20 etching lamination pretreatment according to the prior art.

FIG. 3(a), FIG. 3(b) and FIG. 3(c) show images comparing the surfaces of electroless plated laminates according to exemplary embodiments of the present invention: (a) an electroless plated laminate including no nitrogen-containing component and whose roughness was strictly controlled, (b) an electroless plated laminate including a specific nitrogen-containing component and in which protrusions having a surface roughness Ra of 0.3 μm were uniformly formed, and (c) an electroless plated laminate including a specific nitrogen-containing component and in which protrusions having a surface roughness Ra of 0.6 μm were uniformly formed.

FIG. 4 is a surface image of a copper film having a plurality of crystalline protrusions that is formed on a plating target of a plated laminate by electroless copper plating according to an exemplary embodiment of the present invention.

FIG. 5 shows images comparing the surface roughnesses of electroless plated laminates according to exemplary embodiments of the present invention with those of plated laminates produced by general chemical copper plating.

FIG. 6 shows uniform roughnesses and adhesive strengths of plating targets according to exemplary embodiments of the present invention.

MODE FOR CARRYING OUT THE INVENTION

As the technology described herein allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

The technology described herein overcomes limitations in the application of etching lamination pretreatment, strictly controls roughnesses at high frequencies, and forms uniform roughnesses irrespective of the type of plating target to achieve needs in the art to overcome limitations in the application of etching lamination pretreatment for required microcircuits, strictly control roughnesses to respond to high frequencies, and form roughnesses as uniformly as possible irrespective of the type of plating target FIG. 2 compare (c) the surface of an ultrathin copper foil on which an electroless plated laminate was formed according to an exemplary embodiment of the present invention, (a) the surface of a copper foil etched with brown oxide (Prime bond, YMT) according to the prior art, and (b) the surface of a copper foil etched with a GMZ 20 series product available from YMT by etching lamination pretreatment at 30° C. for 1 minute according to the prior art.

In FIG. 2, (a) shows the surface of an ultrathin copper foil etched with brown oxide. The formation of Cu roughnesses by treatment with brown oxide and subsequent reduction treatment leads to an improvement in mechanical bonding strength. However, the use of brown oxide is accompanied by a circuit reduction due to the reaction with brown oxide and poses a risk of desorption of remaining oxide when the reduction treatment is insufficient.

In FIG. 2, (b) shows the surface of an ultrathin copper foil etched with a GMZ 20 series product available from YMT by etching lamination pretreatment. The formation of a Cu—Sn—Ni alloy and subsequent anti-corrosion treatment (anti-tarnish treatment with silane) leads to an improvement in chemical bonding strength. However, additional post-treatment for patterning should be carried out to remove the Cu—Sn—Ni alloy after the improvement of chemical bonding strength.

In contrast, (c) of FIG. 2 shows the surface of an ultrathin copper foil on which an electroless plated laminate (positive nano roughness) was formed according to an exemplary embodiment of the present invention. The term "electroless plated laminate (positive nano roughness)" as used herein refers to the shape of a copper film in which a plurality of crystalline protrusions are irregularly and continuously arranged on a plating target, unless otherwise specified. The term "plurality of crystalline protrusions" refers to protrusions in the form of unshaped pyramids. Here, the pyramids include, but are not limited to, triangular pyramids, quadrangular pyramids, pentagonal pyramids, hexagonal pyramids, and cones. In this figure, the crystalline protrusions have a shape in which the lower portions are larger in width than the upper portions, but are not limited to this structure and arrangement. Combinations of at least two of the pyramids are possible, if needed. As used herein, the term "roughness" refers to a value determined by surface roughness Ra unless otherwise specified. The roughness Ra is preferably controlled to 1.00 µm or less, 0.66 µm or less or 0.30 µm or less, which meets needs to strictly control roughnesses required for high frequencies. The lower limit of the roughness is not particularly limited but is controlled to 0.01 µm or more, 0.05 µm or more, or 0.10 µm or more, which is preferable considering that the adhesive strength should be above a predetermined level.

The plating target can be selected from metal foils known in the art, such as electro-deposited Cu foils, rolled annealed (RA, HA) Cu foils, and aluminum foils. In particular, the plating target can be one or more types selected from electro-deposited (ED) copper foils and rolled annealed (RA, HA) copper foils.

A detailed description will be given regarding the formation of an electroless plated laminate (positive nano roughness), which is a distinctive technical feature of the subject invention. Referring to (c) of FIG. 2, a plating layer is formed on the surface of a copper foil. The plating layer has a positive nano roughness (shape), which corresponds to the plurality of crystalline protrusions described above. The surface from which the crystalline protrusions protrude is different from the surface etched with brown oxide ((a) of FIG. 2) and the surface etched by etching lamination pretreatment ((b) of FIG. 2).

A plating bath used in (c) of FIG. 2 contains a plating solution having a composition including copper sulfate pentahydrate and a 5- or 6-membered cyclic nitrogen-containing component capable of reacting with the copper sulfate pentahydrate. The electroless plated laminate was produced by depositing a carrier copper foil (18 µm) as a target in the plating solution. A deposition temperature of 34° C. and a deposition time of 15 minutes were applied per 1 µm of the target.

The electroless plated laminate was more clearly investigated by comparing their surface images before and after formation of the plurality of protrusions (FIG. 3). Specifically, FIG. 3 shows images comparing the surfaces of electroless plated laminates according to exemplary embodiments of the present invention before and after formation of a plurality of protrusions. For reference, (a), (b), and (c) of FIG. 3 show electroless plated laminate before formation of a plurality of protrusions, after partial growth of a plurality of protrusions until a surface roughness Ra of 0.3 µm was reached, and after growth of a plurality of protrusions until a larger surface roughness Ra of 0.6 µm was reached, respectively. For reference, a plating bath containing copper sulfate pentahydrate was used in (a) of FIG. 3. The specific composition of the plating bath will be described later. The copper sulfate pentahydrate was used in such an amount that the concentration of copper ions was at least 0.5 g/L. A plating bath used in (b) and (c) of FIG. 3 further contains 0.01 ppm to 1000 ppm of at least one nitrogen-containing component capable of reacting with the copper component. The nitrogen-containing component is selected from purine compounds (including purine, adenine, guanine, hypoxanthine, and xanthine), pyridazine, methylpiperidine, 1,2-di(2-pyridyl)ethylene, 1,2-di(pyridyl)ethylene, 2,2'-dipyridylamine, 2,2'-bipyridyl, 2,2'-bipyrimidine, 6,6'-dimethyl-2,2'-dipyridyl, di-2-pyrylketone, N,N,N',N'-tetraethylenediamine, naphthalene, 1,8-naphthyridine, 1,6-naphthyridine, tetrathiafulvalene, terpyridine, phthalic acid, isophthalic acid, and 2,2'-dibenzoic acid. (b) of FIG. 3 shows the result obtained after deposition at 34° C. for 5 minutes per 0.3 µm of the target and (c) of FIG. 3 shows the result obtained after deposition at 34° C. for 10 minutes per 0.6 µm of the target.

FIG. 4 is a surface image of a copper film having a plurality of crystalline protrusions formed on a plating target of a plated laminate by electroless copper plating according to an exemplary embodiment of the present invention. The image demonstrates that the roughness can be strictly controlled, that is, the roughness can be controlled to a uniform value.

Each of the crystalline protrusions may be formed in an unshaped pyramidal shape. For example, the crystalline protrusions may be various combinations of unshaped triangular pyramids, quadrangular pyramids, pentagonal pyramids, hexagonal pyramids, and cones. The crystalline protrusions may have a shape in which the lower portions are larger in width than the upper portions. Due to their shape, the crystalline protrusions provide improved adhesive strength. Various modifications can be made to the shape and arrangement of the protrusions.

A metal release layer, an organic release layer, an electroplated copper foil or a combination of one or more thereof may be interposed between the copper film and the plating target. A laminate of a chemical copper foil on a release layer may be used, if needed. Here, the release layer may include a silicon oxide film, a silicon nitride film, a fluorine film, melanin or an alkyl acrylate.

One or more insulators selected from prepregs, adhesives, and bonding sheets may be further provided on the copper film.

Figures 5, 6:
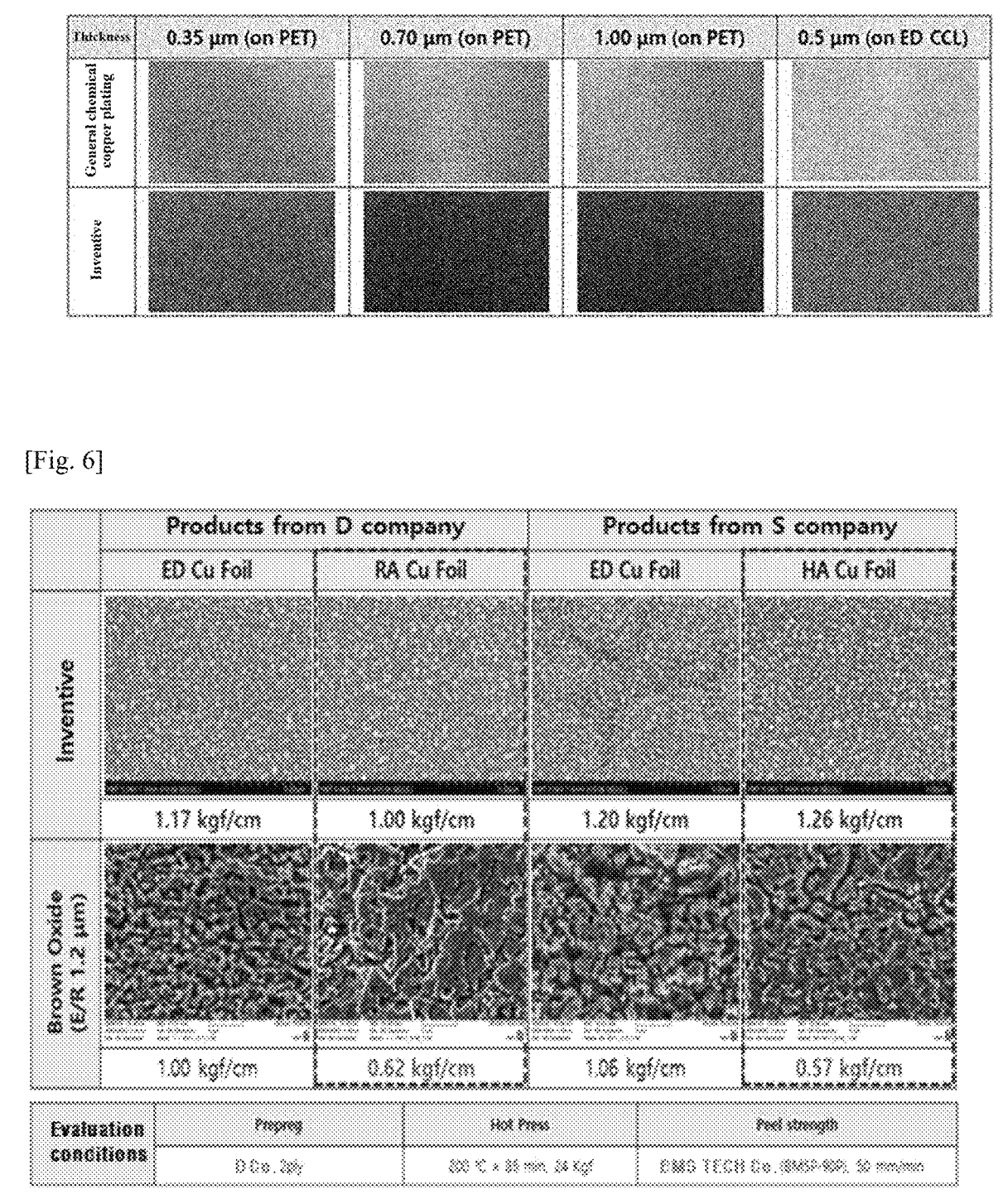

FIG. 5 shows images comparing the surface roughnesses of electroless plated laminates according to exemplary embodiments of the present invention with those of plated laminates produced by general chemical copper plating. For reference, FIG. 5 shows roughnesses measured after treatment of PET resins with plating compositions to exclude the roughness of the base Cu. The plating compositions and conditions are the same as those presented in FIG. 3. Significant differences in roughness were observed at the same thickness.

Electroless plated laminates according to exemplary embodiments of the present invention were produced using different plating targets by treatment with the same plating composition under the same conditions as those presented in FIG. 3. The electroless plated laminates had uniform roughnesses and adhesive strengths. The results are shown in FIG. 6.

As described above, the technology for forming an electroless plated laminate on the surface of a substrate according to one embodiment of the present invention is different from the conventional pretreatment etching technique with a GMZ 20 series product available from YMT or a brown oxide prime bond series product available from YMT (FIG. 2) and the copper plating technique shown in FIG. 5. The formation of the electroless plated laminate structure schematically shown in FIG. 2 requires the use of a plating solution including the smallest possible amount of a copper component capable of forming copper seeds on the surface of a plating target and a nitrogen-containing component capable of diffusing the copper seeds to form the electroless plated laminate structure.

The copper component is preferably selected from components capable of forming copper seeds on the surface of a copper foil and reacting with the nitrogen-containing component that allows the seeds to grow.

The combination of the copper component, for example, a copper salt component selected from copper sulfate pentahydrate, copper chloride, copper nitrate, copper hydroxide, and copper sulfamate, and the nitrogen-containing component, for example, a 5- or 6-membered cyclic nitrogen-containing compound, is preferred in that the effects of providing the desired electroless plated laminate can be maximized without affecting the raw material copper foil. For example, the 5- or 6-membered cyclic nitrogen-containing component may be selected from purine compounds, pyridazine, methylpiperidine, 1,2-di(2-pyridyl)ethylene, 1,2-di(pyridyl)ethylene, 2,2'-dipyridylamine, 2,2'-bipyridyl, 2,2'-bipyrimidine, 6,6'-dimethyl-2,2'-dipyridyl, di-2-pyrylketone, N,N,N',N'-tetraethylenediamine, naphthalene, 1,8-naphthyridine, 1,6-naphthyridine, tetrathiafulvalene, terpyridine, phthalic acid, isophthalic acid, 2,2'-dibenzoic acid, and combinations thereof.

The plating composition for providing the electroless plated laminate may include the copper salt component in such an amount that the copper ion concentration is at least 0.5 g/L, preferably 1 g/L to 30 g/L, more preferably 1 g/L to 20 g/L. Considering the efficiency of the reaction for growing copper seeds formed on the surface of the copper foil, it would be desirable that the copper salt component is added in properly divided amounts or is continuously added throughout the reaction, if needed.

The 5- or 6-membered cyclic nitrogen-containing component used in combination with the copper salt component may be present in an amount of 0.01 ppm to 1000 ppm, preferably 0.05 ppm to 10 ppm, in the composition.

If necessary, the plating composition for providing the electroless plated laminate may include one or more chelating agents. Examples of usable chelating agents include organic acids (such as carboxylic acids) and salts thereof, but are not limited thereto. Such carboxylic acids include, but are not limited to, tartaric acid, citric acid, acetic acid, malic acid, malonic acid, ascorbic acid, oxalic acid, lactic acid, succinic acid, and salts thereof. The salts include alkali metal salts of organic acids (such as potassium sodium tartrate), and Rochelle salts (including dipotassium tartrate). The chelating agents may also include one or more compounds selected from hydantoin, hydantoin derivatives, for example, 1-methylhydantoin, 1,3-dimethylhydantoin, and 5,5-dimethylhydantoin, nitriloacetic acid and alkali metal salts thereof, triethanolamine, ethylenediaminetetraacetic acid (EDTA) and alkali metal salts thereof, for example, tetrasodium ethylenediaminetetraacetate, modified ethylene diamine tetraacetic acids, for example, N-hydroxyethylenediamine triacetate, hydroxyalkyl substituted dialkaline triamines, for example, pentahydroxy propyldiethylenetriamine, and other compounds, for example, N,N-dicarboxymethyl L-glutamic acid tetras odium salt, S,S-ethylene di amine di succinic acid and N,N,N',N'-tetrakis(2-hydroxypropyl)ethylenediamine(ethylenedinitrilo)tetra-2-propanol.

Preferably, the chelating agents are selected from Rochelle salts, dipotassium tartrate, and mixture thereof. The chelating agents may be present in a total amount of at least 0.5 g/L, preferably 1 g/L to 150 g/L, more preferably 10 g/L to 100 g/L, most preferably 15 g/L to 50 g/L in the composition.

If necessary, the plating composition for providing the electroless plated laminate may include one or more pH adjusting agents. The pH adjusting agents serve to adjust the pH of the alkali composition to a desired pH range and may be compounds known in the art. Examples of the alkaline compounds include, but are not limited to, alkali metal hydroxides such as sodium hydroxide, potassium hydroxide, and lithium hydroxide. Sodium hydroxide, potassium hydroxide or mixtures thereof are typically used. The alkaline compounds may be present in a total amount to provide a pH range of 8 or more, preferably 10 to 14, and more preferably 11 to 13.5.

If necessary, the plating composition for providing the electroless plated laminate may include one or more reducing agents. General reductive materials such as formaldehyde can be used as the reducing agents. Other examples of the reducing agents include, but are not limited to, hypophosphite salts such as alkali metal hypophosphites (for example, sodium hypophosphite) and sulfinate compounds such as sodium hydroxymethanesulfinate. The reducing agents may also include glyoxylic acid, formaldehyde, boron hydride salts, and dimethylamine borane. Such general reducing agents are present in general amounts, preferably in a total amount of 1 g/L or more, more preferably 5 g/L to 20 g/L. The composition is free of glyoxylic acid and environmentally unfriendly reducing agents. More preferably, the composition is free of environmentally unfriendly reducing agents such as formaldehyde, boron hydride, and dimethylamine borane (DMAB).

If necessary, acid degreasing and pre-dip may be used for pretreatment. The acid degreasing may be a general degreasing process for copper foil. Cleansing agents such as sulfuric acid and organic acids may be used for the acid degreasing, and examples thereof include SAC-302 and SAC-615 series products available from YMT. The acid degreasing is appropriately performed by treating with a cleansing agent at a concentration of 100 ml/L at 45 to 55° C. for 4 to 6 minutes. The acid degreasing conditions may vary depending on the use environment and equipment conditions.

Then, it is preferable to perform 0.1-0.2 μm soft etching. This process is to form slight roughnesses on the base Cu surface, facilitating Pd adsorption by a subsequent catalytic process. A composition for the soft etching may be a blend of a SE 500 series product available from YMT and a sulfuric acid solution. The soft etching is appropriately performed by treating with a SE 500 series product at a concentration of 200 ml/L and sulfuric acid (95%) at a concentration of 30 ml/L at 25 to 35° C. for 1 to 2 minutes. The soft etching conditions may vary depending on the use environment and equipment conditions.

Then, the soft-etched copper surface is pre-dipped. The pre-dip is performed to prevent subsequent contamination with a catalyst solution and more effectively adsorb Pd. The pre-dip is preferably performed by treatment with about 90 ml/L sulfuric acid (61.5%) for 20-40 sec. The pre-dip conditions may vary depending on the use environment and equipment conditions.

Then, a catalytic process is performed using a catalyst solution that is advantageous in terms of Pd adsorption efficiency. For example, a Cata 855 series product from YMT is appropriately used as an ionic palladium catalyst. Palladium can be adsorbed on the Cu surface by treatment with 30 ml/L Cata 855 and 90 ml/L sulfuric acid (61.5%) at 30 to 35° C. for 2 to 5 minutes. The catalytic process conditions may vary depending on the use environment and equipment conditions.

Thereafter, electroless plating is performed on the surface of the copper foil using the non-etching roughness composition of the present invention. General plating time and temperature conditions can be applied for the electroless plating. Typically, copper can be deposited at a temperature of 20-60° C. or 30-40° C. To this end, the copper foil may be dipped in or sprayed with the non-etching roughness composition. Typically, the electroless plating can be performed for 2 to 30 minutes or 5 to 20 minutes, but the plating time may also vary depending on the desired metal thickness. The plating is preferably performed in an alkaline environment such that no metal cladding on the substrate is corroded.

The method of the present invention can also be used to improve the adhesive strength of a light-permeable resin such as a dry film, a solder mask, an adhesive or a polymerized material such as a polymerized etching resist to the surface of the electroless plated laminate provided through circuit integration and strict roughness control. For example, uniform roughnesses having a positive nano shape may be formed on the surface of a substrate using the non-etching roughness composition of the present invention to enhance the adhesiveness of a dry film. As another example, uniform roughnesses having a positive nano shape may be formed on the surface of a printed circuit board using the non-etching roughness composition of the present invention to enhance the adhesiveness of a solder mask before application of the solder mask.

According to one embodiment, the present invention eliminates the need to form a black or brown copper oxide layer, unlike previously developed technologies. Although a slight circuit loss may be caused due to the treatment with a small amount of S/E in the present invention, an increase in thickness due to the plating reaction can sufficiently compensate for this circuit loss.

For example, the electroless plated laminate may be produced on a copper foil surface using a plating solution containing one or more copper ion sources and one or more chelating agents.

The composition may also be prepared by mixing the above components in an aqueous solution, preferably a solution of deionized water. The components of the composition may be optionally mixed. The composition is stable enough not to form copper oxide during storage and copper deposition. The composition generally satisfies industrial standards required for commercially acceptable electroless copper baths and is used at a commercially acceptable rate to plate the copper foil.

The electroless plated laminate of the present invention has a surface roughness Ra of, for example, 1 μm or less, preferably 0.66 μm or less, more preferably 0.3 μm or less, as measured at a high frequency. For reference, a roughness of 1 μm or less is required for a frequency of 5 GHz and a roughness of 0.66 μm or less is required for a frequency of 10 GHz.

The surface on which the electroless plated laminate is formed may have a peel strength of at least 1.00 kgf/cm or more from a polymerizable material (such as a polyimide film) or a prepreg layer laminated on the coated surface, particularly 1.17 kgf/cm or more from an electro-deposited copper (ED Cu) foil (see FIG. 6).

According to a further embodiment of the present invention, there is provided a method for producing a plated laminate, including (a) providing a plating target on a substrate and (b) forming a copper film having a plurality of crystalline protrusions on the surface of the plating target.

In step (b), the copper film having a plurality of crystalline protrusions is formed using a plating solution containing the smallest possible amount of a copper component capable of forming copper seeds on the surface of the plating target and a nitrogen-containing component capable of diffusing the copper seeds to form a plurality of protrusions on the surface of the plating target.

The copper component may form copper seeds on the surface of the plating target and may react with the nitrogen-containing component that allows the seeds to grow.

The copper component may be selected from copper sulfate, copper chloride, copper nitrate, copper hydroxide, and copper sulfamate. The nitrogen-containing component may be a 5- or 6-membered cyclic nitrogen-containing compound.

The 5- or 6-membered cyclic nitrogen-containing compound may be one or more types selected from purine compounds (including purine, adenine, guanine, hypoxanthine, and xanthine), pyridazine, methylpiperidine, 1,2-di(2-pyridyl)ethylene, 1,2-di(pyridyl)ethylene, 2,2'-dipyridylamine, 2,2'-bipyridyl, 2,2'-bipyrimidine, 6,6'-dimethyl-2,2'-dipyridyl, di-2-pyrylketone, N,N,N',N'-tetraethylenediamine, naphthalene, 1,8-naphthyridine, 1,6-naphthyridine, tetrathiafulvalene, terpyridine, phthalic acid, isophthalic acid, and 2,2'-dibenzoic acid.

The copper component may be present in such an amount in the plating bath that the copper ion concentration is at least 0.5 g/L.

The 5- or 6-membered cyclic nitrogen-containing component may be present in an amount of 0.01 ppm to 1000 ppm in the plating bath.

Step (a) may include cleansing, acid degreasing, pre-dip, and activation for pretreatment.

In step (b), the copper seeds are preferably formed by electroless plating.

The method may further include anti-corrosion treatment after step (b).

According to another embodiment of the present invention, there is provided a printed circuit board including the plated laminate.

The plating lamination technology for providing a highly adhesive inner layer of a printed circuit board is effective in providing an electroless plated laminate, including a non-etched/low-roughness pretreated laminate or a low-roughness copper foil, and a printed circuit board including the plated laminate. The present specification and the drawings attached hereto merely illustrate some of the technical ideas included in the above-described technology and those skilled in the art can readily recognize various modifications without departing from the scope of the technical ideas in the specification and drawings of the technology described herein.

The invention claimed is:

1. A plated laminate comprising a plating target and a copper film having a plurality of crystalline protrusions formed on the plating target by electroless copper plating, wherein the crystalline protrusions are copper crystals having a surface roughness Ra of 0.01~1.00 μm.

2. The plated laminate according to claim 1, wherein each of the crystalline protrusions has a shape in which the lower portion is larger in width than the upper portion.

3. The plated laminate according to claim 1, wherein each of the crystalline protrusions is formed in a pyramidal shape.

4. The plated laminate according to claim 1, wherein a metal release layer, an organic release layer, an electroplated copper foil or a laminate thereof is interposed between the plating target and the copper film.

5. The plated laminate according to claim 1, wherein one or more insulators are further provided on the copper film.

6. A printed circuit board comprising the plated laminate according to claim 1.

* * * * *